(12) United States Patent
Chen et al.

(10) Patent No.: US 11,018,089 B2
(45) Date of Patent: May 25, 2021

(54) DISPLAY DEVICES AND METHODS FOR MANUFACTURING THE SAME

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/242,228

(22) Filed: Jan. 8, 2019

(65) Prior Publication Data
US 2020/0219820 A1 Jul. 9, 2020

(51) Int. Cl.
| | |
|---|---|
| *H01L 23/544* | (2006.01) |
| *H01L 33/00* | (2010.01) |
| *H01L 27/15* | (2006.01) |
| *H01L 33/50* | (2010.01) |
| *H01L 33/52* | (2010.01) |
| *H01L 33/62* | (2010.01) |

(52) U.S. Cl.
CPC .......... *H01L 23/544* (2013.01); *H01L 27/156* (2013.01); *H01L 33/0093* (2020.05); *H01L 33/502* (2013.01); *H01L 33/52* (2013.01); *H01L 33/62* (2013.01)

(58) Field of Classification Search
CPC ... H01L 21/6835; H01L 23/544; H01L 33/52; H01L 33/62; H01L 33/0093
See application file for complete search history.

(56) References Cited

U.S. PATENT DOCUMENTS

| | | |
|---|---|---|
| 2013/0161628 A1 | 6/2013 | Suzuki et al. |
| 2017/0025593 A1 | 1/2017 | Bower et al. |
| 2017/0236866 A1 | 8/2017 | Lee et al. |
| 2017/0294479 A1 | 10/2017 | Cha et al. |
| 2018/0190672 A1 | 7/2018 | Lee et al. |
| 2019/0035817 A1* | 1/2019 | Park ....................... G02B 5/201 |
| 2019/0067406 A1* | 2/2019 | Lee .................... H01L 27/3276 |
| 2020/0035762 A1* | 1/2020 | Kim ..................... G02F 1/1303 |
| 2020/0185333 A1* | 6/2020 | Higashisaka ....... H01L 25/0753 |

FOREIGN PATENT DOCUMENTS

KR    10-1902566 B1    9/2018

OTHER PUBLICATIONS

European Search Report dated Apr. 9, 2020, issued in application No. EP 19220015.2.
European Office Action dated Apr. 1, 2021 issued in application No. EP 19 220 015.2.

* cited by examiner

*Primary Examiner* — Joseph M Galvin, III
(74) *Attorney, Agent, or Firm* — McClure, Qualey & Rodack, LLP

(57) ABSTRACT

A method for manufacturing a display device is provided. The method includes providing an array module having at least one first alignment mark. The method also includes providing a light-emitting module having at least one second alignment mark. The method further includes aligning the light-emitting module and the array module by the at least one first alignment mark and the at least one second alignment mark. In addition, the method includes bonding the light-emitting module onto the array module.

11 Claims, 16 Drawing Sheets

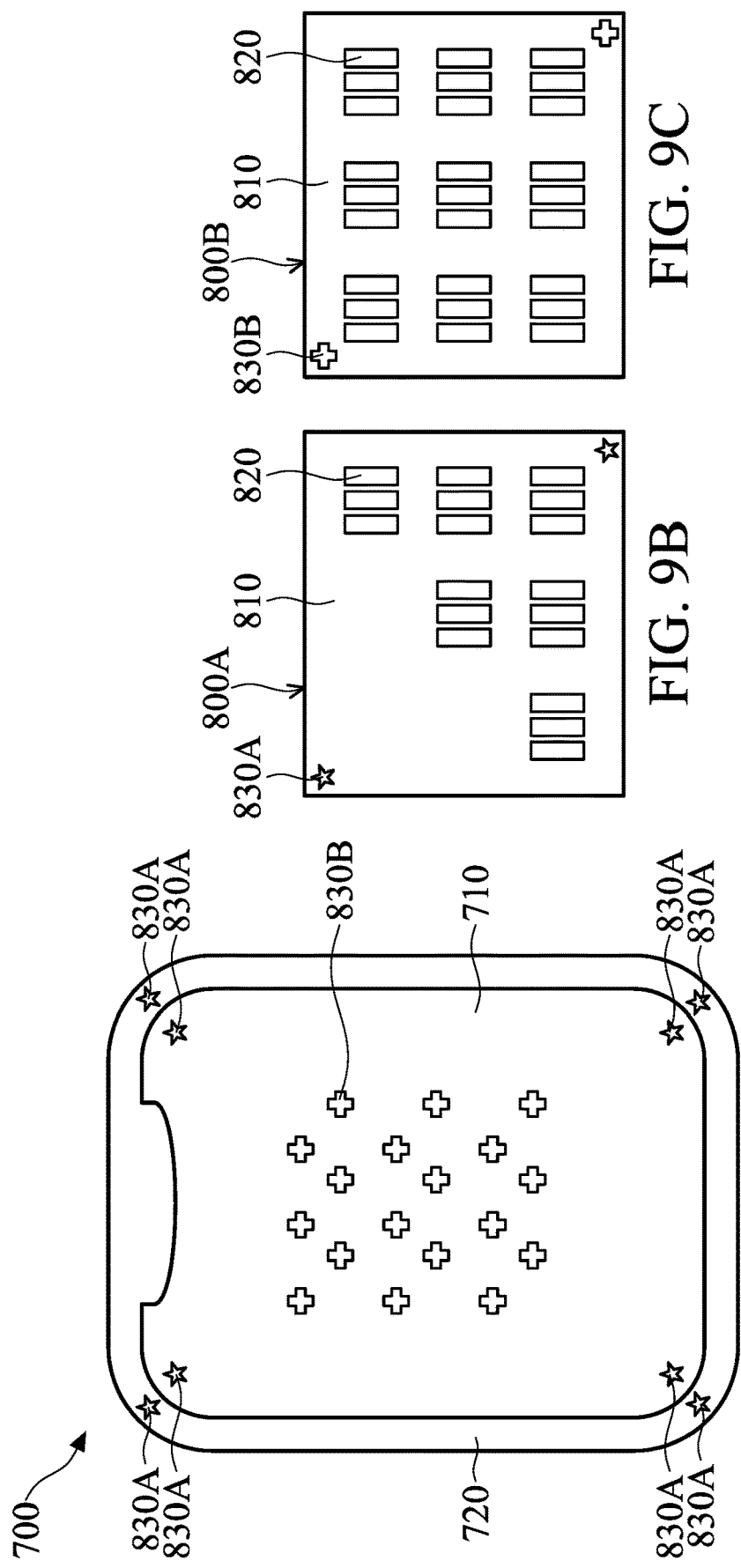

DISPLAY DEVICES AND METHODS FOR MANUFACTURING THE SAME

BACKGROUND

Field of the Disclosure

The embodiments of the disclosure relate to a display device, and in particular to a display device with an alignment mark on a light-emitting module.

Description of the Related Art

The display devices are becoming more widely used. Since mass production has recently become the tendency in the light-emitting diode industry, any increase in the yield of manufacturing light-emitting diodes, such as increasing the alignment accuracy. Therefore, the manufacturing method for the display devices may need to be continuously improved.

SUMMARY

A method for manufacturing a display device is provided. The method includes providing an array module having at least one first alignment mark. The method also includes providing a light-emitting module having at least one second alignment mark. The method further includes aligning the light-emitting module and the array module by the first alignment mark and the second alignment mark. In addition, the method includes bonding the light-emitting module onto the array module.

A display device is provided. The display device includes an array module having a first alignment mark. The array module includes a first substrate and a circuit layer disposed on the first substrate. The array module also includes a plurality of pads disposed on the circuit layer. The display device also includes a light-emitting module having a second alignment mark. The light-emitting module includes a second substrate and a plurality of light-emitting elements. The plurality of light-emitting elements disposed on the second substrate and electrically connected to the plurality of pads. The second alignment mark is aligned with the first alignment mark.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 9A is a top view of a display device in accordance with some embodiments of the present disclosure;

FIGS. 9B and 9C are top views of light-emitting modules in accordance with some embodiments of the present disclosure;

DETAILED DESCRIPTION OF THE DISCLOSURE

Figure 1:
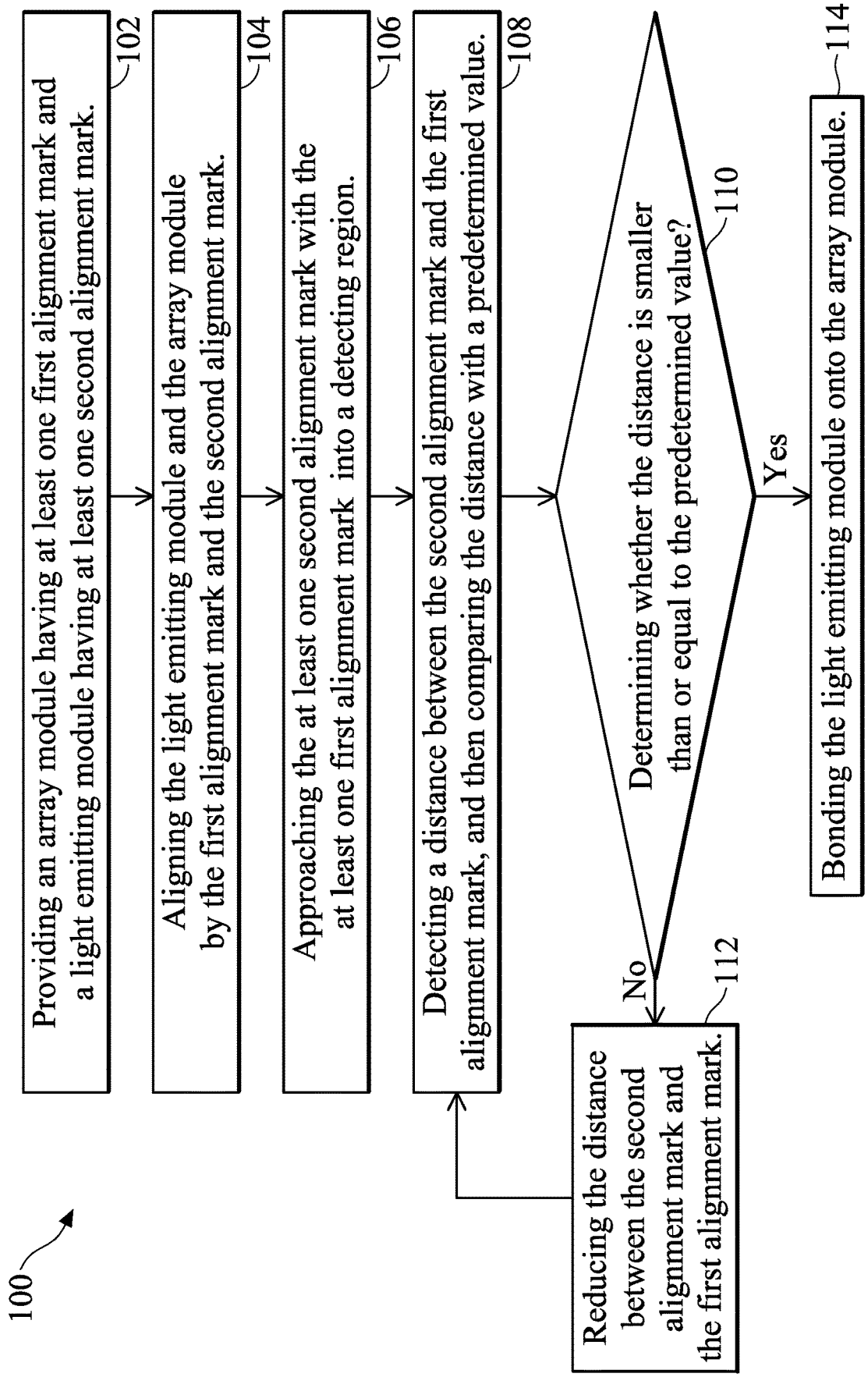
FIG. 1 is a flow chart for manufacturing a display device in accordance with some embodiments of the present disclosure.

The display device of the present disclosure is described in detail in the following description. The drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer is disposed above another layer", "a layer is disposed on another layer" may indicate that the layer is in direct contact with the other layer, or that the layer is not in direct contact with the other layer, there being one or more intermediate layers disposed between the layer and the other layer.

The terms "about" and "substantially" typically mean +/−20% of the stated value, +/−10% of the stated value, +/−5% of the stated value, +/−3% of the stated value, +/−2% of the stated value, +/−1% of the stated value or +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal,", "vertical,", "on,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides a method for manufacturing a display device. Refer to FIG. 1, which is a flow chart 100 for manufacturing a display device. The flow chart 100 includes multiple steps 102, 104, 106, 108, 110, 112 and 114. Each of steps may correspond to FIGS. 2A-2G or FIGS. 3A-3D. FIGS. 2A-2G illustrate the steps in the top view. FIGS. 3A-3D illustrate the steps in the cross-sectional view. In some embodiments, other steps may be appropriately added before or after above the steps. In some embodiments, the above partial steps may be appropriately deleted or replaced. In some embodiments, the above sequence of steps can be changed or modulated as needed.

Figures 2A, 2B:
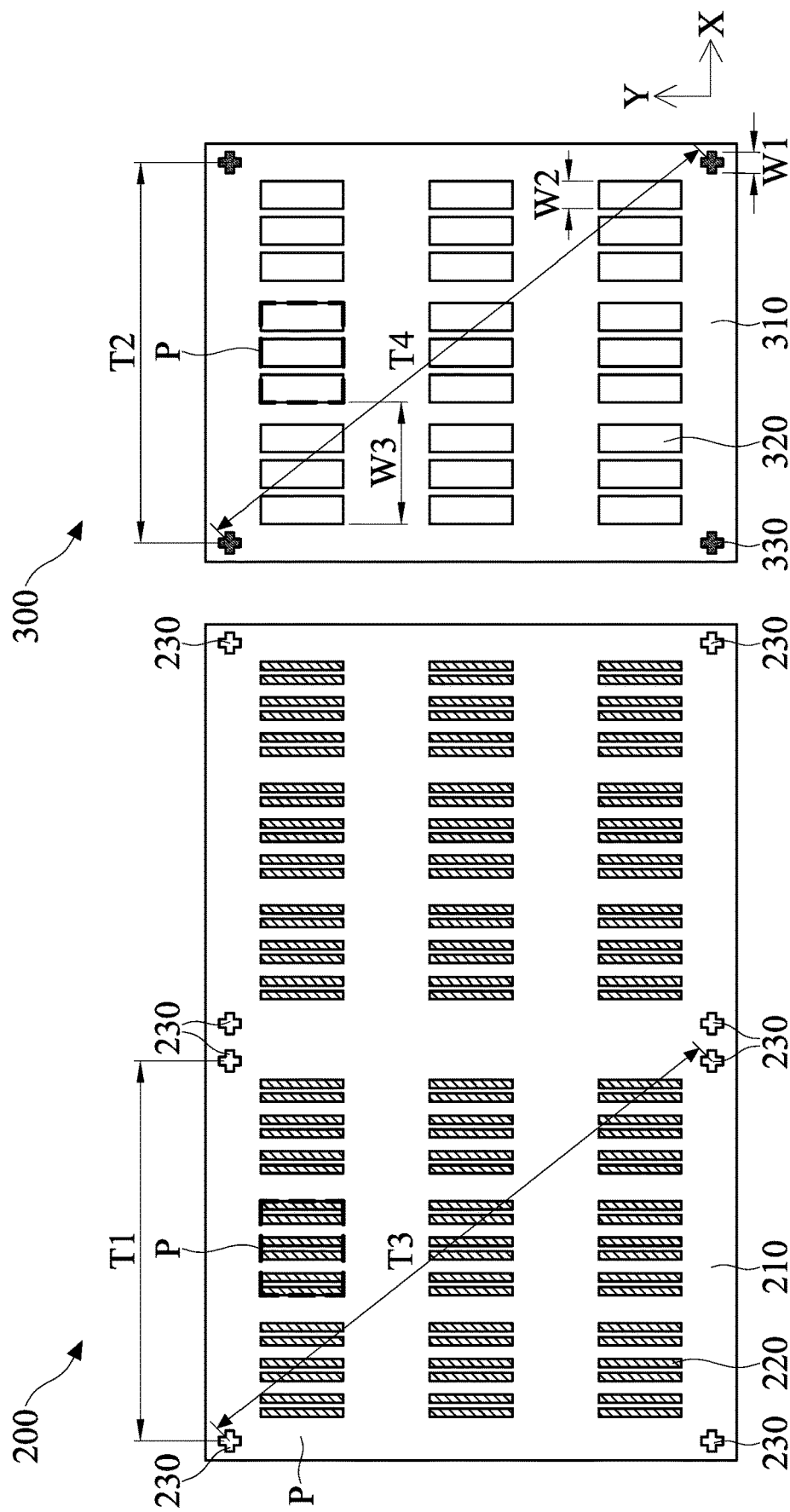
FIGS. 2A-2G are top views of various stages of a process for manufacturing a display device in accordance with some embodiments of the present disclosure.

The method for manufacturing the display device includes the step 102 of providing an array module having at least one first alignment mark and a light-emitting module having at least one second alignment mark. As shown in FIGS. 2A and 2B, an array module 200 and a light-emitting module 300 are provided. As shown in FIG. 2A, the array module 200 includes a first substrate 210. The first substrate 210 may include a glass substrate, a ceramic substrate, a plastic substrate or another suitable substrate, but not limited. The first substrate 210 may include polyimide (PI), polycarbonate (PC), or polyethylene terephthalate (PET), but not limited thereto. The array module 200 includes a plurality of pads 220. The pads 220 are disposed on the first substrate 210. The material of the pad 220 may include copper (Cu), aluminum (Al), molybdenum (Mo), gold (Au), chromium (Cr), nickel (Ni), platinum (Pt), titanium (Ti), iridium (Ir), other suitable material, or the above alloy, but is not limited. FIG. 2A illustrates a pixel P that may correspond to (or electrically connected to) six pads 220, and a sub-pixel (correspond to one light-emitting elements 320) may respectively correspond to two pads 220, but is not limited thereto. The dotted line may correspond to a position where the pixel (not shown in FIG. 2A) is expected to be bonded. As shown in FIG. 2B, one pixel P may include three sub-pixels, and a sub-pixel may respectively correspond to or electrically connected to two pads 220 after bonding (subsequent step 114 will be described). In other embodiments (not shown), a pixel P may correspond to (or electrically connected to) four pads 220, for example, one of the four pads 220 is a shared pad, the shared pad is electrically connected to three sub-pixels of the pixel P, and other pads may respectively correspond to (or electrically connected to) three sub-pixels with different colors. In some embodiments, at least part of the pixel P may overlap with corresponding pads 220 in Z direction, and Z direction may defined as a normal direction of the first substrate 210 of the array module 200. In some embodiments (shown in FIG. 2A), the array module 200 includes at least one first alignment mark 230 on the first substrate 210.

As shown in FIG. 2B, the light-emitting module 300 includes a second substrate 310. The second substrate 310 may be a carrier substrate or growth substrate, but is not limited. In some embodiments, the second substrate 310 may include a glass substrate, a ceramic substrate, a plastic substrate, a sapphire substrate or another suitable substrate, but is not limited. The growth substrate may include silicon or a sapphire substrate, which includes alumina oxide, GaP, GaAs, AlGaAs, SiC, Si, or another suitable material, but is not limited.

The light-emitting module 300 includes a plurality of light-emitting elements 320. The light-emitting elements 320 may be disposed on the second substrate 310. The light-emitting element 320 may be a red sub-pixel, a green sub-pixel or a blue sub-pixel, an infrared (IR) sub-pixel, or other sub-pixel with other colors. In some embodiments, the light-emitting element 320 may include light-emitting diode (LED), micro LED (pLED), mini LED, quantum dot (QD), quantum dot LED (QLED or QDLED) or other suitable element, but is not limited. In some embodiments, the light-emitting element 320 may emit blue light (or UV light), but is not limited. In some embodiments, the light-emitting element 320 may respectively emit the light with different colors (such as red, green, blue or other suitable colors). In some embodiments, the light-emitting module 300 may include the light conversion elements, the light conversion elements (such as quantum dot, but is not limited) may be disposed on or adjacent to the light-emitting module 300.

As shown in FIG. 2B, the light-emitting module 300 includes at least one second alignment mark 330 on the second substrate 310. In some embodiments, at least one pixel P may be disposed between two adjacent second alignment marks 330, but not limited, the quantity of pixel P can be adjusted as needed.

In some embodiments, the position of the second alignment mark 330 of the light-emitting module 300 may correspond to the position of the first alignment mark 230 of the array module 200. For example, four second alignment marks 330 of the light-emitting module 300 may respectively correspond to one of four first alignment marks 230 on the right part (or on the left part) of the array module 200, but not limited. As shown in FIGS. 2A and 2B, there is a distance T1 between two adjacent first alignment marks 230 along the X direction, and there is a distance T2 between two adjacent second alignment marks 330 along the X direction. X direction may be defined as a direction parallel to an extension direction of the long side of the first substrate 210, but not limited. In some embodiments, the X direction may be defined as an arrangement direction of adjacent pixels. In some embodiments, the X direction may be defined as an arrangement direction of sub-pixels of the pixel P. Y direction may be perpendicular with Z direction and X direction. Distance T1 may be defined as a distance between a center of one of the first alignment marks 230 and a center of another the first alignment mark 230 adjacent to the one of the first alignment marks 230 along the X direction (or Y direction). Distance T2 may be defined as a distance between a center of one of the second alignment marks 330 and a center of another the second alignment marks 330 adjacent to the one of the second alignment marks 330 along the X direction (or Y direction). In some embodiments, the ratio of the distance T1 to the distance T2 is in a range from 0.8 to 1.2, but not limited. In some embodiments, the ratio of the distance T1 to the distance T2 is in a range from 0.9 to 1.1. In addition, there is a distance T3 between two first alignment marks 230 which are respectively disposed on two sides of a diagonal line of the right part (or the left part) of the first substrate 210, and there is a distance T4 between two second alignment marks 330 which are respectively disposed on two sides of diagonal line of the second substrate 310. Distance T3 may be defined as a distance between a center of one of the first alignment marks 230 and a center of another first alignment mark 230 along a direction of the diagonal line. Distance T4 may be defined as a distance between a center of one of the second alignment marks 330 and a center of another second alignment marks 330 along a direction of the diagonal line. In some embodiments, the ratio of distance T3 to distance T4 is in a range from 0.8 to 1.2, but not limited. In some embodiments, the ratio of distance T3 to distance T4 is in a range from 0.9 to 1.1. When the ratio of distance T3 to distance T4 (or distance T1 to distance T2) is in the range mentioned above, the accuracy of bonding the array module 200 and the light-emitting module 300 may be increased.

In some embodiments, the distance between two adjacent first alignment marks 230 along the X direction is the same as or different from the distance between two adjacent first alignment marks 230 along the Y direction. In some embodiments, the distance between two adjacent second alignment marks 330 along the X direction (such as distance T2) is the same as or different from the distance between two adjacent second alignment marks 330 along the Y direction.

As shown in FIG. 2B, the second alignment mark 330 has a width W1. The light-emitting element 320 has a width W2. The width W2 may be a maximum width of one of the light-emitting elements 320 in X direction. The width W1 may be a maximum width of one of the second alignment mark 330 in X direction. In some embodiments, the width W1 is less than or equal to the width W2. In some embodiments, the width W1 is greater than the width W2. In some embodiments, an area of the light-emitting element 320 may be defined as a lighting area of one sub-pixel operating at a highest grayscale in Z direction, but not limited. In some embodiments, an area of the light-emitting element 320 may defined as a lighting surface (such top surface of the light-emitting element 320) of one sub-pixel, but not limited. In some embodiments, an area of the light-emitting element 320 may be defined by the openings of the light blocking layer 630 (shown in FIG. 5 to FIG. 6).

Figure 2C:
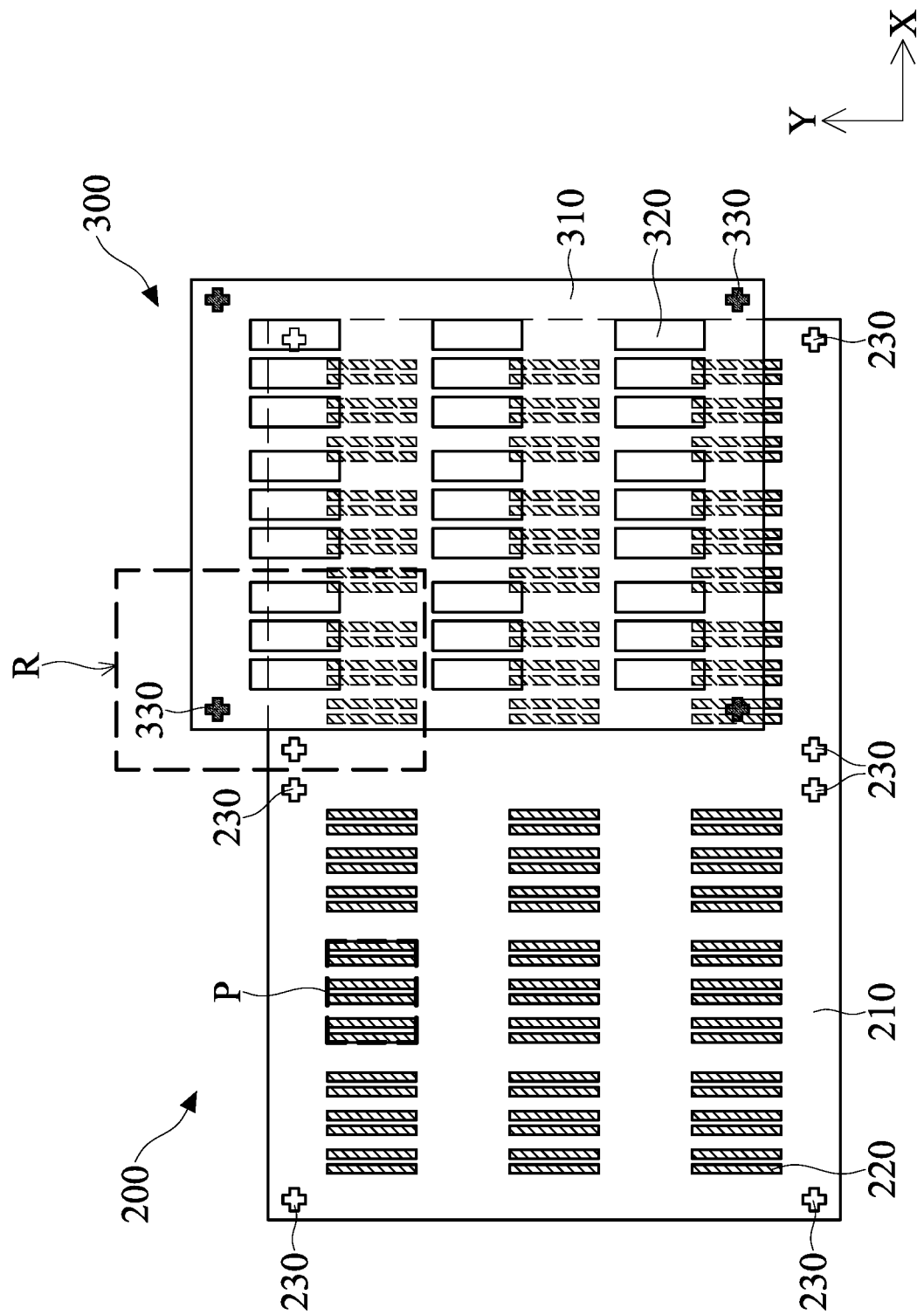

The method for manufacturing the display device includes the step 104 that aligning the array module 200 and the light-emitting module 300 by the first alignment mark 230 and the second alignment mark 330. As shown in FIG. 2C, the light-emitting module 300 may approach (or be transferred to) the right part (or left part) of the array module 200.

Figure 2E:
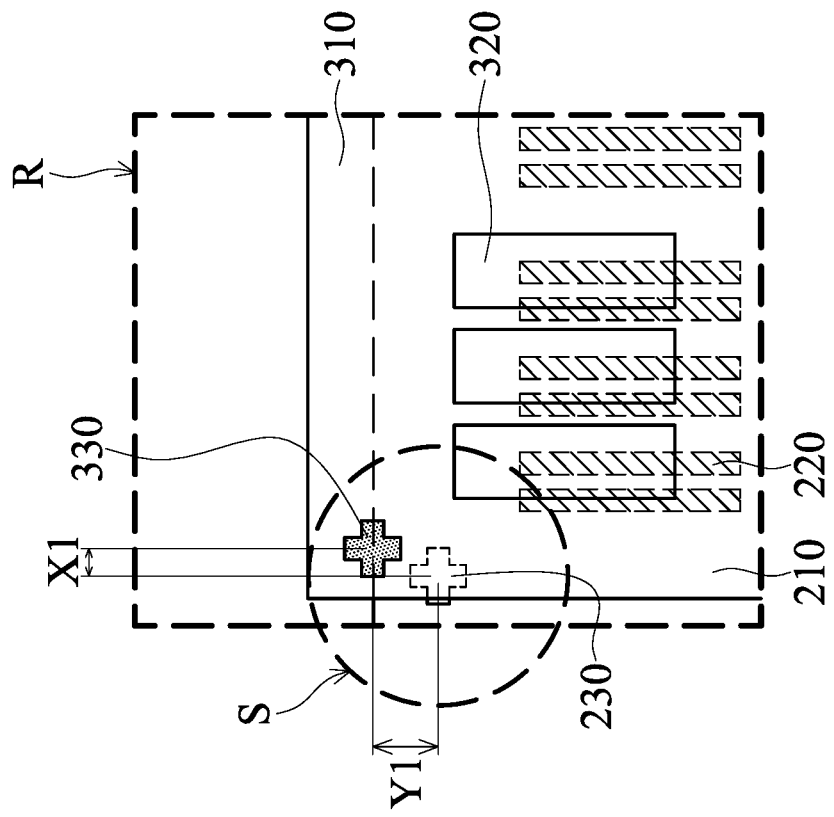
Figure 2D:
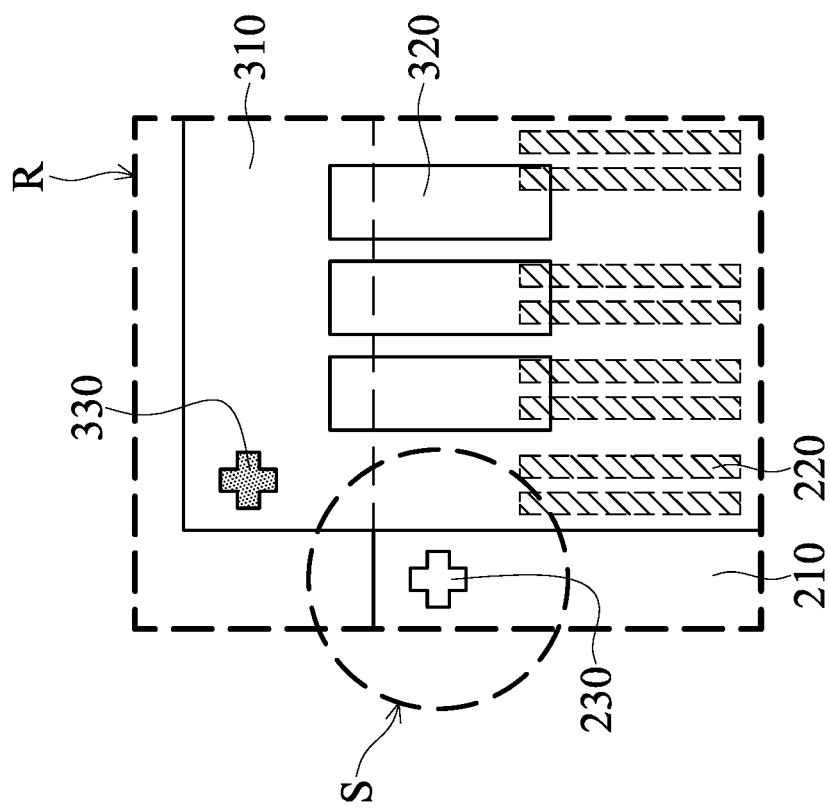

The method for manufacturing the display device includes the step 106 that approaching the at least one second alignment mark 330 with the at least one first alignment mark 230 into a detecting region S. Refer to FIG. 2D, which is an enlarged view of region R shown in FIG. 2C. As shown in FIG. 2D, the detecting region S may be a region that can be detected by a charge-coupled device (CCD) camera (not shown) or other suitable image equipment (or camera equipment), but not limited. When at least one of the second alignment mark 330 and the first alignment mark 230 is outside the detecting region S, the light-emitting module 300 or the array module 200 may be transferred, so that the second alignment mark 330 and the first alignment mark 230 would be inside the detecting region S.

The method for manufacturing the display device includes the step 108 that detecting the distance between the second alignment mark 330 and the first alignment mark 230, and comparing the distance with a predetermined value. In some embodiment, the distance between the second alignment mark 330 and the first alignment mark 230 detected by the step 108 may be defined as a mismatch between the second alignment mark 330 and the first alignment mark 230. Refer to FIG. 2E, which is an enlarged view of the region R shown in FIG. 2C. After the second alignment mark 330 and the first alignment mark 230 are inside the detecting region S, the distance between the first alignment mark 230 and the second alignment mark 330 is detected by the CCD camera or other suitable image equipment (or camera equipment), but not limited, and the distance between the first alignment mark 230 and the second alignment mark 330 will be compared with the predetermined value. In some embodiments (shown in FIG. 2B), one pixel pitch P has a width W3, and the predetermined value is less than or equal to half of the width W3. The width W3 may be a distance between the centers (left sides or right sides) of the two adjacent pixels P, but not limited. For example, the pixel pitch P may be a distance between the centers (left sides or right sides) of two adjacent sub-pixels with the same color. That is, the mismatch between the second alignment mark 330 and the first alignment mark 230 is less than half of the pixel pitch P of the display device.

The method for manufacturing the display device includes the step 110 that determining whether the distance ex. mismatch) is less than or equal to the predetermined value. For example, the step 110 includes determining whether the distance (ex. mismatch) X1 along the X direction (or the distance (ex. mismatch) Y1 along the Y direction) is less than or equal to the predetermined value.

If the distance X1 (or the distance Y1) is greater than the predetermined value, the step 112 will be performed. The step 112 includes reducing the distance between the second alignment mark 330 and the first alignment mark 230. In addition, the step 112 includes adjusting the position of the array module 200 or the light-emitting module 300, so that the first alignment mark 230 would be aligned with (or overlapped with) the second alignment mark 330. In some embodiments, the step 112 includes approaching the array module 200 or the light-emitting module 300 along the X direction (or the Y direction or other directions), so that the first alignment mark 230 would be aligned with (or overlapped with) the second alignment mark 330, but not limited. After the performing of the step 112, the step 108 is performed to detect the distance between the first alignment mark 230 and the second alignment mark 330 along the X direction (or the Y direction or other directions).

Figure 2F:
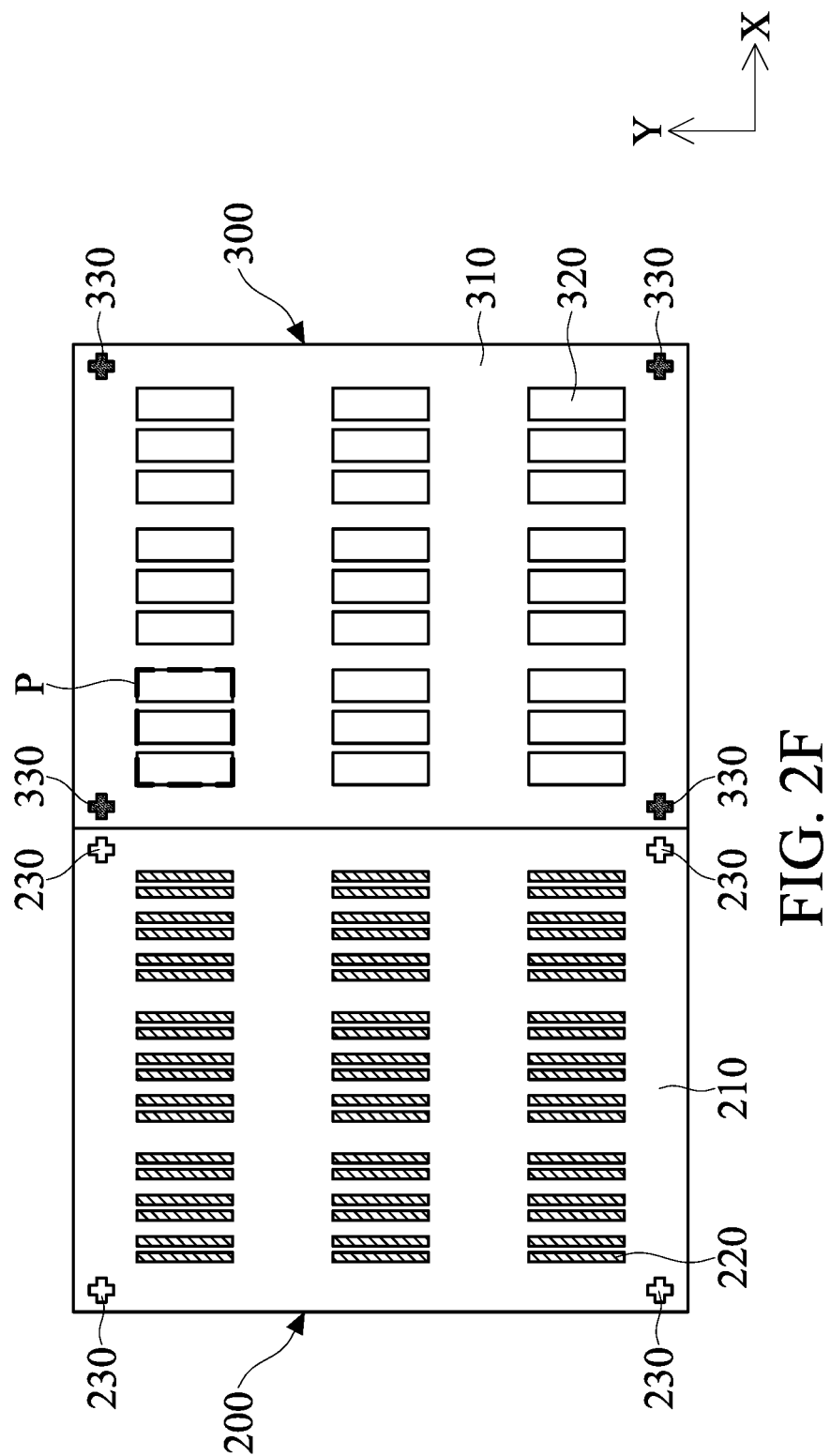

In some embodiments, if both the distance X1 and the distance Y1 are less than or equal to the predetermined value, the step 114 will be performed. The step 114 includes bonding the light-emitting module 300 onto the array module 200. As shown in FIG. 2F, after bonding the light-emitting module 300 onto the array module 200, the second substrate 310 may be disposed on the right part (left part or other part) of the first substrate 210, but not limited. Moreover, the light-emitting elements 320 may be electrically connected to the corresponding pad 220. In some embodiments, the light-emitting elements 320 may respectively overlap with part of the corresponding pad 220 in Z direction.

In some embodiments, the predetermined value is less than or equal to half of the width W3 of the pixel pitch P. In some embodiments, the predetermined value is equal to the width W2. When the predetermined value is in the range mentioned above, the production yield of bonding the array module 200 and the light-emitting module 300 may be increased.

Figure 2G:
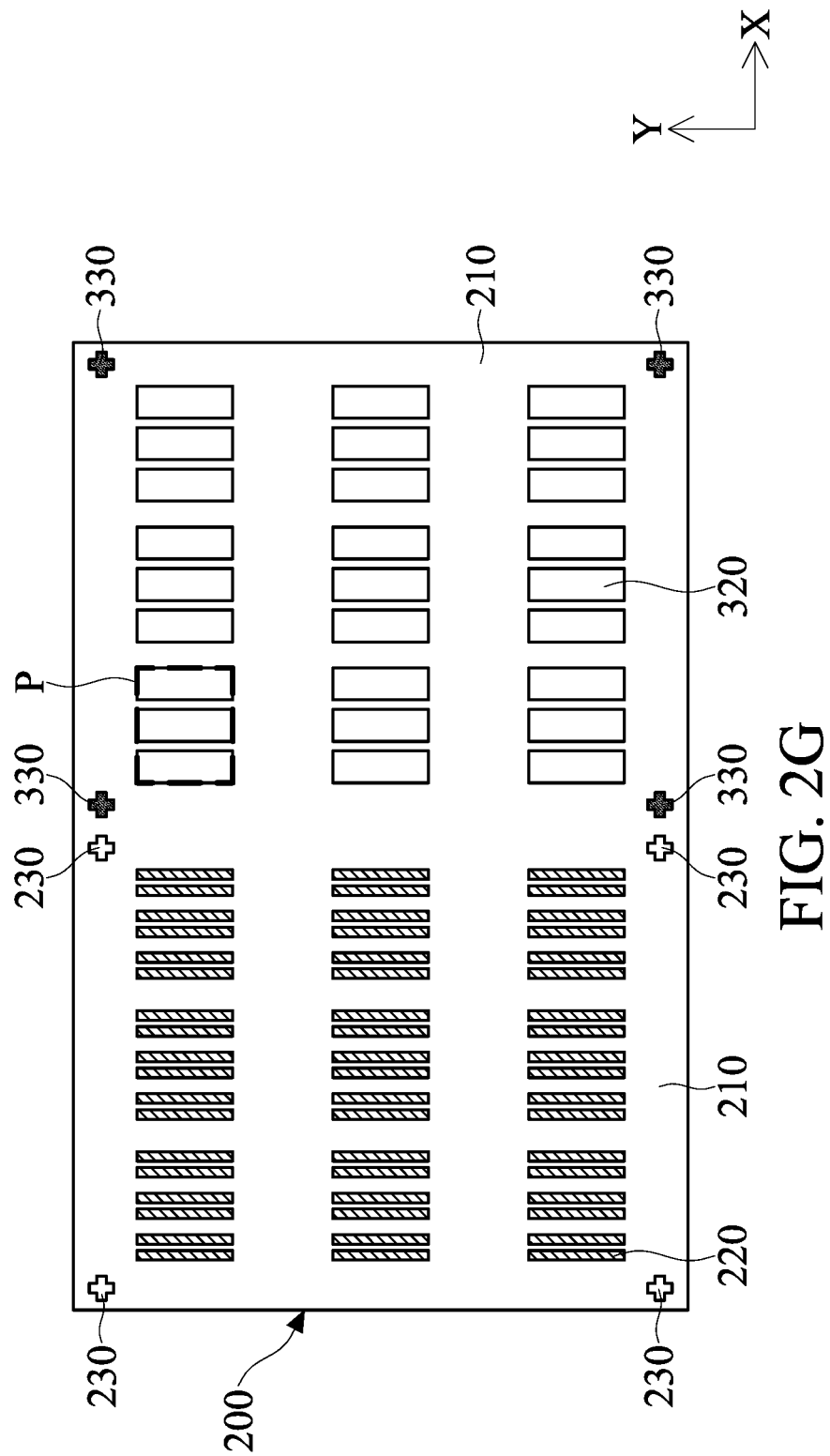

In some embodiments, the second substrate 310 may be removed (as shown in FIG. 2G), and the light-emitting elements 320 are disposed on (or bonded onto) the pad 220. In some embodiments, the second substrate 310 may be removed by a laser or other suitable methods. In some embodiments, the second substrate 310 may not be removed, and the second substrate 310 and the light-emitting elements 320 may disposed on the array module 200. The process shown in FIGS. 2A-2G may be repeated so that another light-emitting module 300 may be disposed on (or bonded on) the another part (such as left part) of the array module 200.

The process shown in FIGS. 2A-2G may be used in mass production of the display device, but not limited. For example, nine pixels may be disposed on (or bonded onto) the corresponding pads 220 in same bonding process, but not limited. In some embodiments, the second substrate 310 may be used as a growth substrate, and the second alignment marks may be disposed on (or formed on) the second substrate 310. In some embodiments, the second substrate 310 may be used as a carrier substrate, and the light-emitting elements 320 may be transferred onto the second substrate 310, and then transferred onto (or disposed on) the array module 200, but not limited. In some embodiments, the quantity (number) of first alignment marks 230 may be greater than or equal to the quantity (number) of the second alignment marks 330, but not limited. In some embodiments, the light-emitting module 300 may have four second alignment marks 330, and the four second alignment marks 330 may respectively be disposed at four corners of the second substrate 310, but not limited. In some embodiments, the quantity of the second alignment marks 330 in light-emitting module 300 is greater than (or less than) four, and the second alignment marks 330 may be disposed at other suitable position of the second substrate 310. In some embodiments, the light-emitting module 300 has two second alignment marks 330, and two second alignment marks 330 may respectively be disposed at two diagonal corners of the second substrate 310. In some embodiments, the light-emitting module 300 may have at least one second alignment mark 330. The quantity of the first alignment marks 230 or the position of the first alignment marks 230 may be correspond to the second alignment marks 330, which can be adjusted according to the needs.

Refer to FIGS. 3A-3G, which are cross-sectional views of various stages of a process for manufacturing the display device. In some embodiments, the array module 200 includes a circuit layer 240, and the circuit layer 240 is disposed on (or formed on) the first substrate 210. Furthermore, the circuit layer 240 may include wires 250, other conductive elements (not shown), other dielectric layers (not shown), but not limited. In some embodiments, the pads 220 may be disposed on (or electrically connected to) the circuit layer 240. In some embodiments (shown in FIG. 3A), the first alignment mark 230 may be disposed on the circuit layer 240. In some embodiments, the first alignment mark 230 may be disposed in (or formed in) the circuit layer 240 (not shown in FIGS. 3A-3G, but shown in FIG. 5). In some embodiments, the material of the wires 250 may be the same as or different from the pads 220, the wires 250 or other conductive elements of the circuit layer 240. In some embodiments, the first alignment mark 230 and the pads 220, the wires 250 or other conductive elements of the circuit layer 240 may be formed in the same process or different process, but not limited. In some embodiment, the first alignment mark 230 may be formed before the process of forming the circuit layer 240. In some embodiment, the first alignment mark 230 may be formed after the process of forming the pad 220. In some embodiment, the material of the first alignment mark 230 may include opaque materials, shading materials, reflective materials or a combination of the above, but is not limited thereto. In some embodiment, the material of the first alignment mark 230 may include metal material, metal alloy, black photoresist or other suitable material, but is not limited thereto.

Figure 3A:
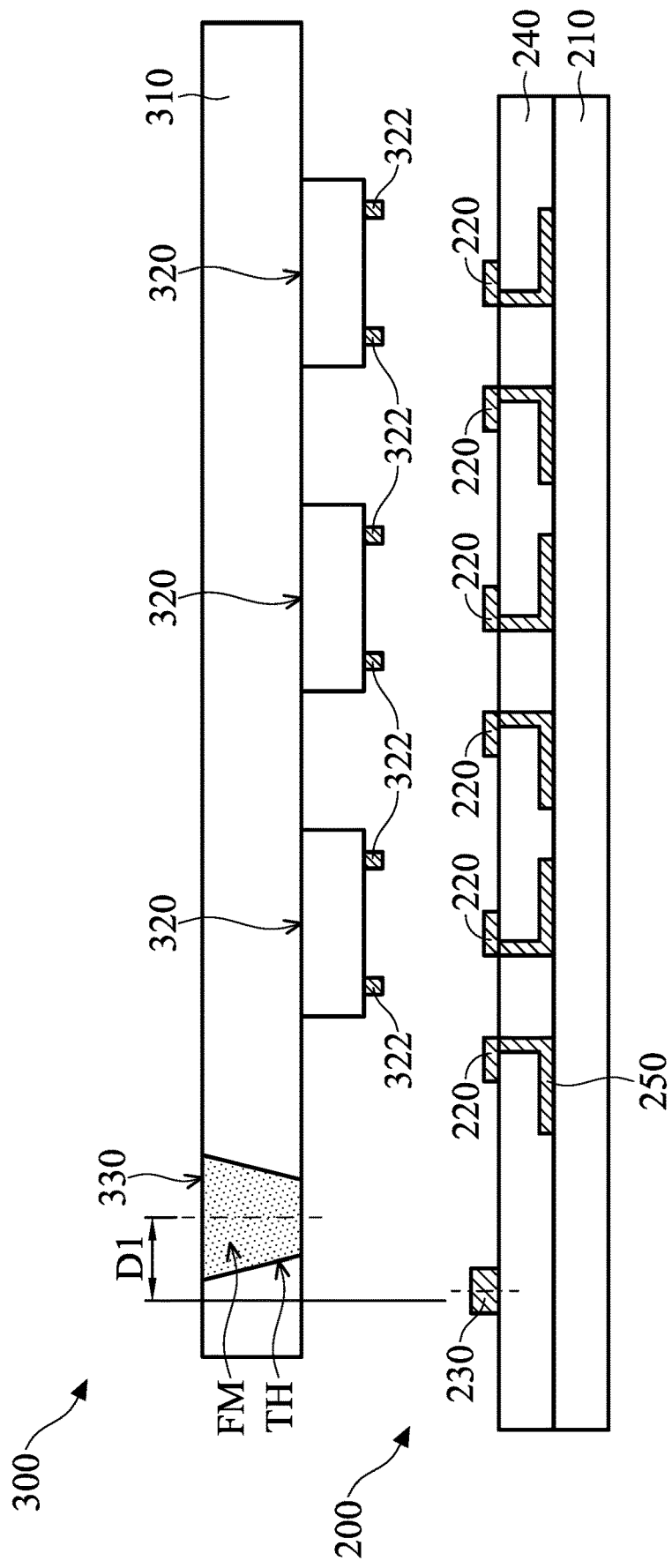
FIGS. 3A-3D are cross-sectional views of various stages of a process for manufacturing a display device in accordance with some embodiments of the present disclosure.

As shown in FIG. 3A, the light-emitting module 300 includes a plurality of pads 322 disposed on the light-emitting element 320.

As shown in FIG. 3A, the distance D1 may be a distance between a center of the first alignment mark 230 and a center of the second alignment mark 330 along the X direction (or the Y direction). If the distance D1 is greater than the predetermined value, the position of the light-emitting module 300 will be fine-tuned.

Figure 3B:
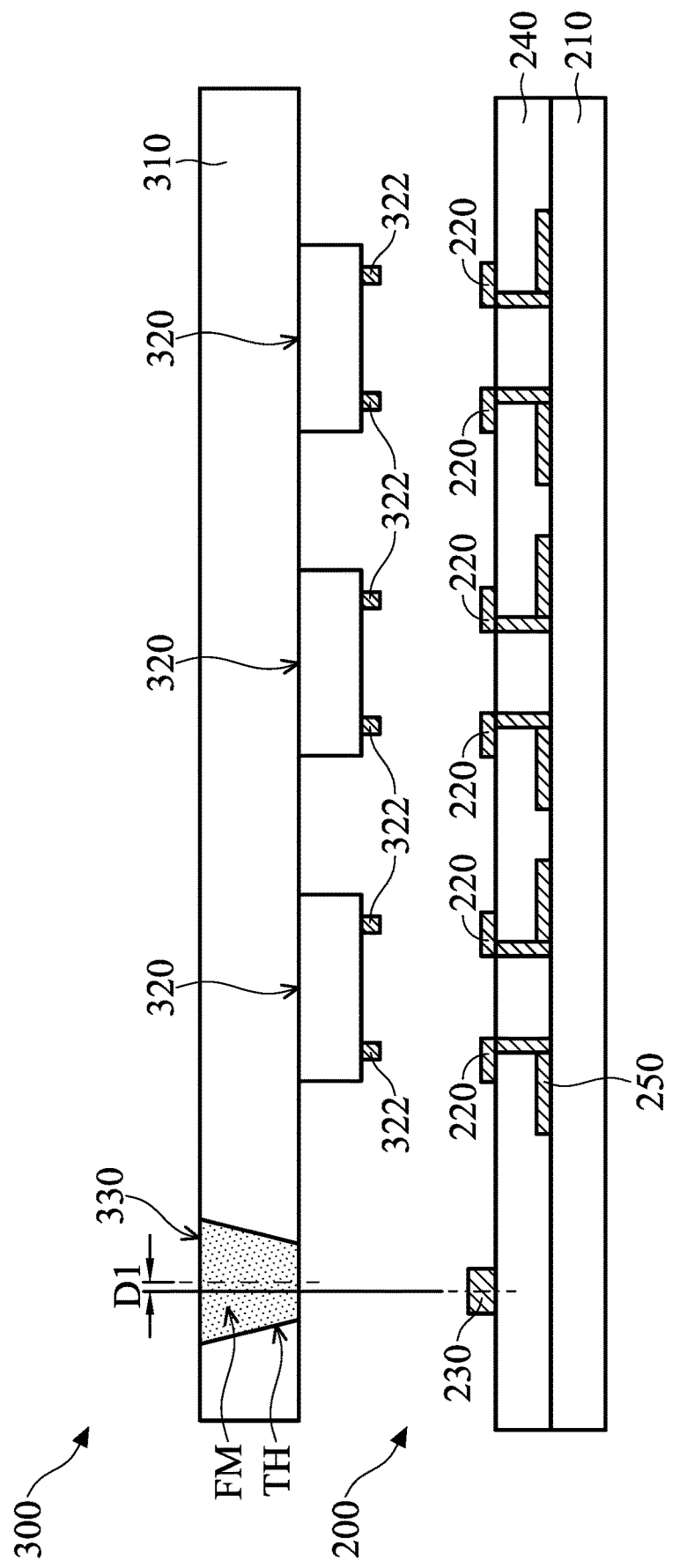
Figure 3C:
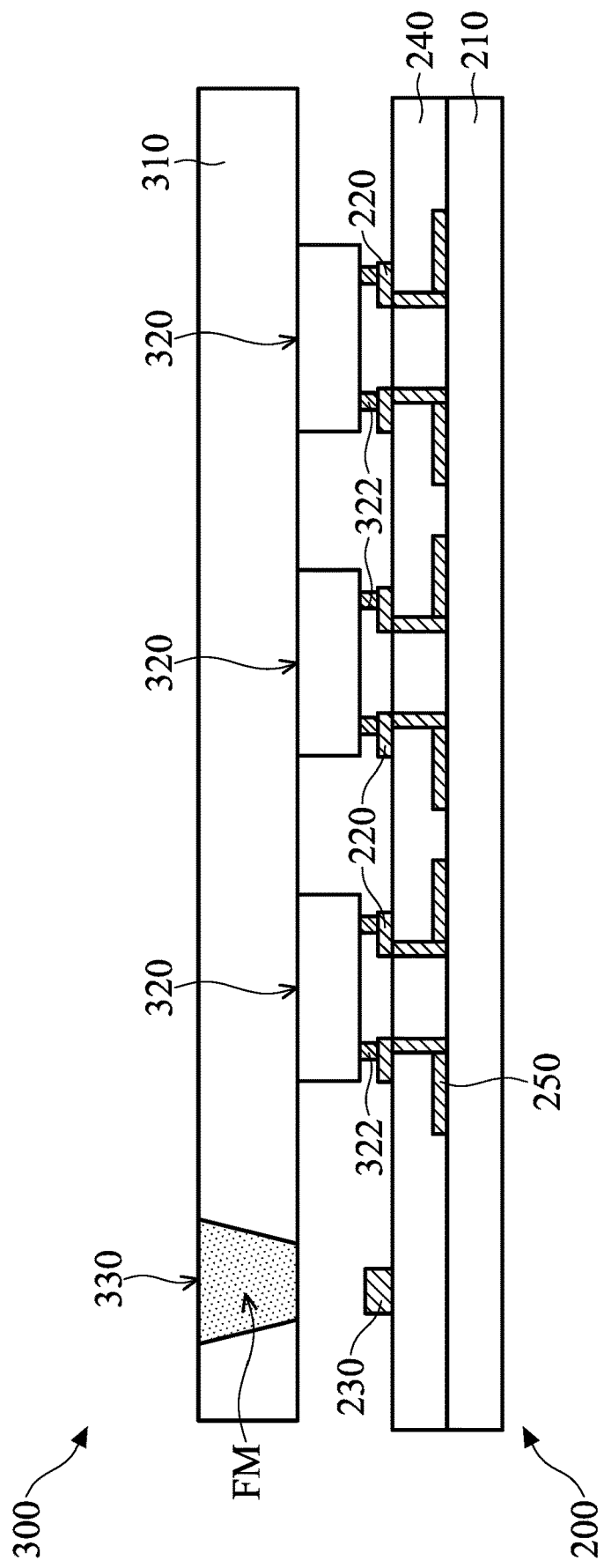

As shown in FIG. 3B, the position of the light-emitting module 300 is fine-tuned. If the distance D1 is less than or equal to the predetermined value, the light-emitting module 300 is bonded onto the array module 200 as shown in FIG. 3C. After the bonding process, the second alignment mark 330 may approximately overlap with the first alignment mark 230 in Z direction, or the second alignment mark 330 may approximately aligned with the first alignment mark 230.

Figure 3D:
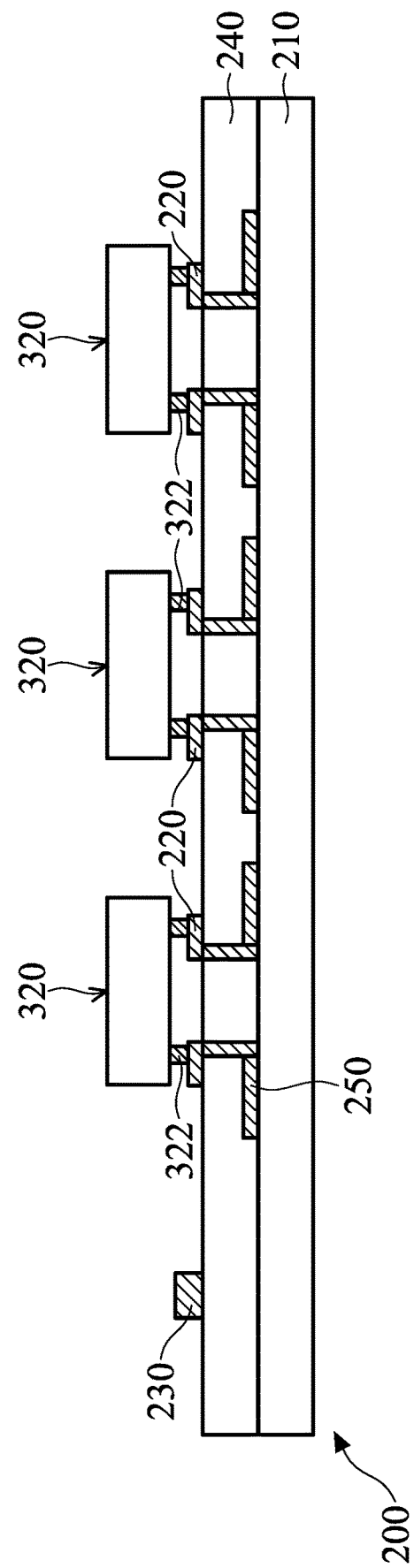

As shown in FIG. 3D, after the light-emitting module 300 is disposed on (or bonded onto) the array module 200, the second substrate 310 may be removed, but not limited. The light-emitting elements 320 and the pads 322 may be disposed on the array module 200. In some embodiment, the pads 322 of the light-emitting module 300 may electrically connected to (or contact with) the corresponding pads 220 of the array module 200. In some embodiment, the light-emitting element 320 may be electrically connected to the pad 220 through the pad 322. If the distance D1 is less than or equal to the predetermined value, the production yield in mass producing the display device can increase.

Figure 4B:
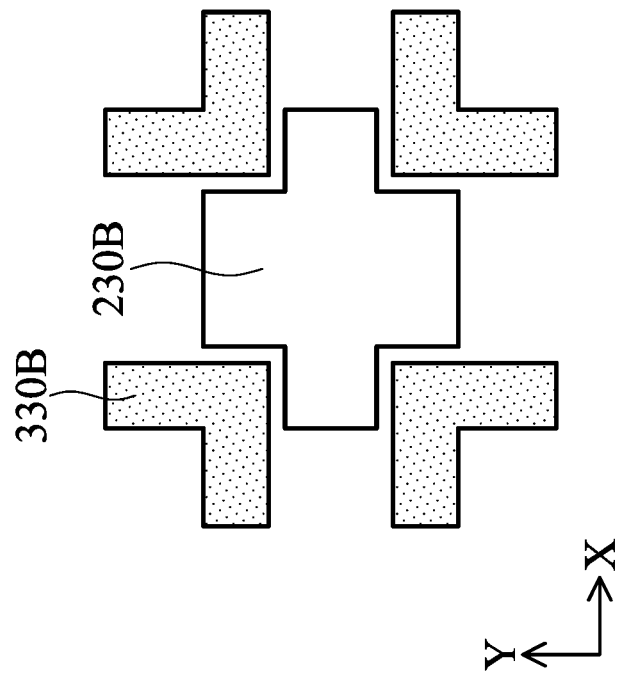
FIGS. 4A and 4B are top views of a first alignment and a second alignment of a display device in accordance with some embodiments of the present disclosure.
Figure 4A:
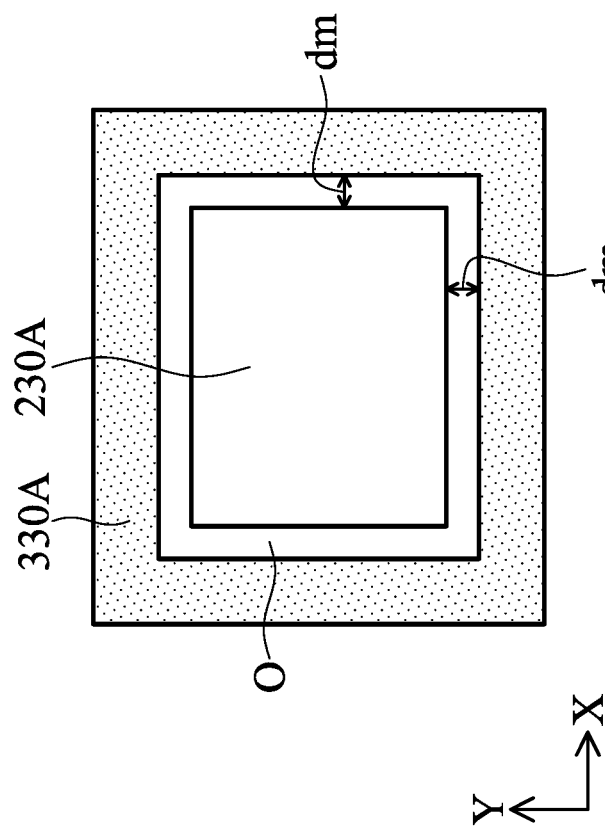

Refer to FIGS. 4A and 4B, which are top views of a first alignment and a second alignment in accordance with some embodiments. The profile of the first alignment marks and second alignment marks shown in FIGS. 4A and 4B are merely examples, and the present disclosure is not limited thereto. In some embodiments, the first alignment mark 230A and the second alignment mark 330A are in different shapes. In some embodiments, the second alignment mark 330A may be adjacent to the first alignment mark 230A. In some embodiments, the second alignment mark 330A may enclose the first alignment mark 230A, as shown in FIG. 4A. In some embodiments, the second alignment mark may have an opening O, at least part the opening O may overlap with the first alignment mark 230A in Z direction, but not limited. In some embodiments, at least part of the second alignment mark 330A may overlap with at least part of the first alignment mark 230A in Z direction. In some embodiments, the shape of the first alignment mark 230A and the shape of the second alignment mark 330A may include rectangle, circle, triangle, polygon, arc shape, obtuse angle shape, acute angle shape, round shape or other suitable shapes, but is not limited. In some embodiments, the shape of the first alignment mark 230A may be the same as or different from the shape of the second alignment mark 330A. In some embodiments, a distance dm between the second alignment mark 330A and the first alignment mark 230A in X direction (or Y direction) is greater than or equal to 0, and less than or equal to the width W2 (shown in FIG. 2B). Distance dm may be defined as the minimum distance between the second alignment mark 330A and the first alignment mark 230A in X direction (or Y direction). In some embodiments, the position of the first alignment mark 230A and the position of the second alignment mark 330A can be exchanged.

In some embodiments, the second alignment mark 330B may have discontinuous parts, as shown in FIG. 4B. In some embodiments, the profile of the shape of the second alignment mark 330B is different from or the same as the shape of the first alignment mark 230B. The first alignment mark 230B may have a cross-shape, rectangular shape, polygonal shape, curved shape, circular shape, arc shape, obtuse angle shape, acute angle shape, round shape or other suitable shapes, but not limited. In some embodiments, the first alignment mark 230B may include protruding portions. The second alignment mark 330B may be adjacent to the first alignment mark 230B, and the second alignment mark 330B may have any shape correspond to (or in accordance with) the shape of the first alignment mark 230B, but not limited. For example, the second alignment mark 330B may have an L-shape (or other shape) and extend into the space between two adjacent protruding portions of the first alignment mark 230B, but not limited. The above "the alignment mark 330B has any shape correspond to (or in accordance with) the shape of the first alignment mark 230B" includes that the alignment mark 330B has any shape correspond to at least one side of the first alignment mark 230B. It should be noted that, one of the second alignment marks 330B may have discontinuous parts, these parts may correspond to one of the first alignment marks 230B, these parts can form a second alignment marks 330B, and these parts may have similar or different shapes. In some embodiments, the position of the first alignment mark 230B and the position of the second alignment mark 330B can be exchanged. In some embodiments, the shape of the first alignment mark 230B and the shape of the second alignment mark 330B may be complement each other.

Figure 5:
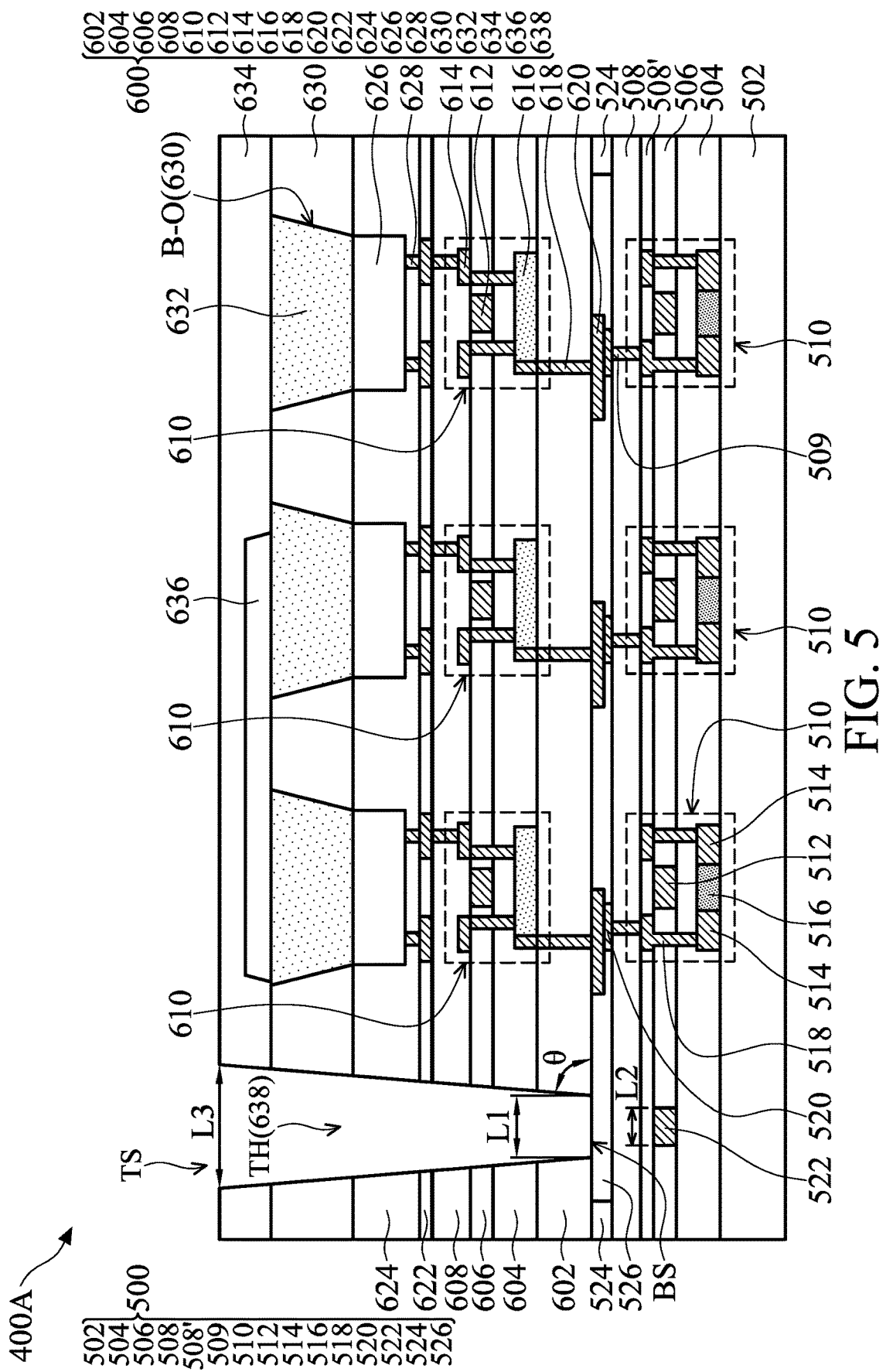
FIGS. 5-8 is a cross-sectional view of a display device in accordance with some embodiments of the present disclosure.

Refer to FIG. 5, which is a cross-sectional view of a display device 400A in accordance with some embodiments. The display device 400A may include an array module 500 and a light-emitting module 600. The array module 500 may include a substrate 502. The material of the substrate 502 may be the same as or similar to the material of the first substrate 210. In some embodiments, some insulating layers 504, 506, 508', 508 may be sequentially disposed on the substrate 502. The insulating layers 504, 506, 508 may include, but are not limited to, silicon oxide, silicon nitride, silicon oxynitride or another suitable material.

A plurality of transistors 510 is disposed on the substrate 502. The transistor 510 may be a thin film transistor (TFT). For example, the transistor 510 may include a gate electrode 512, a source/drain electrode 518, and a semiconductor layer 516. The gate electrode 512 may be disposed on the insulating layer 504 and the semiconductor layer 516. The source/drain electrode 518 may be disposed on the semiconductor layer 516 and the doping layers 514, and the semiconductor layer 516 may be disposed between the doping layers 514. The material of the gate electrode 512 and the source/drain electrode 518 may include, but is not limited to, copper (Cu), aluminum (Al), molybdenum (Mo), gold (Au), chromium (Cr), nickel (Ni), titanium (Ti), other suitable material or alloy. The material of the semiconductor layer 516 may include, but is not limited to, amorphous silicon, polysilicon such as low-temp polysilicon (LTPS), metal oxide or other suitable materials. The metal oxide may include indium gallium zinc oxide (IGZO), indium zinc oxide (IZO), indium gallium zinc tin oxide (IGZTO) or other suitable material.

The array module 500 may include a plurality of wires 509 and pads 520. The pads 520 may be disposed on the insulating layer 508 and the wires 509. The transistor 510 may be electrically connected to the pad 520 through the wire 509, but not limited. The material of the wire 509 and the pad 520 may be the same as or different from the material of the source/drain electrode 518.

In some embodiments, the first alignment mark 522 may be disposed on the insulating layer 504. In some embodiments, the first alignment mark 522 and the gate electrode 512 may be formed in the same process. In some embodiments, the material of the first alignment mark 522 and the material of the gate electrode 512 may be same. In some embodiments, the first alignment mark 522 may include metal material that is disposed in the insulating layer 506. In other embodiments, the first alignment mark 522 and the pad 520 may be formed in the same process. In some embodiments, the material of the first alignment mark 522 and the material of the gate electrode 512 may be same. In other embodiments, the material of the first alignment mark 522 and the material of source/drain electrode 518 may be same.

As shown in FIG. 5, the light-emitting module 600 includes a substrate 602. The substrate 602 may include a glass substrate, a ceramic substrate, a plastic substrate or another suitable substrate, but not limited. The material of the substrate 602 may include sapphire, Si, SiC, other suitable materials or combinations thereof, but are not limited thereto. In some embodiments, the light-emitting module 600 may include insulating layers 604, 606, 608, and the insulating layers 604, 606, 608 are disposed on the substrate 602. The insulating layers 604, 606, 608 may include, but are not limited to, silicon oxide, silicon nitride, silicon oxynitride or another suitable material. The light-emitting module 600 may include a plurality of the transistors 610. For example, the transistor 610 may include a gate electrode 612, a source/drain electrode 614, and a semiconductor layer 616. The gate electrode 612 may be disposed on the insulating layer 604. The materials of the gate electrode 612, the source/drain electrode 614 and the semiconductor layer 616 may be the same as, similar to or different from those of the gate electrode 512, the source/drain electrode 518 and the semiconductor layer 516, respectively. The light-emitting module 600 includes a plurality of wires 618 and pads 620. In some embodiments, the transistor 610 may be electrically connected to the pad 620 through the wire 618. In some embodiments, and the transistor 510 may be electrically connected to the transistor 610. In some embodiments, the pad 520 may be electrically connected to (or contact with) the pad 620. In some embodiments, the transistor 610 may use as a driving transistor. In some embodiments, the transistor 510 may use as a switch transistor. In some embodiments, more transistors (or elements) may be disposed on the substrate 602 or the substrate 502, such as reset transistor or capacitor, but not limited. In some embodiments, the transistor 610 and the transistor 510 may disposed on the same substrate (such as substrate 602 or the substrate 502). The structure of the transistor 610 (or the transistor 510) described above is an example, and the disclosure is not limited thereto. In some embodiments, the transistor 610 (or the transistor 510) can be top gate thin film transistor, bottom gate thin film transistor, double gate thin film transistor, but not limited. In addition, the transistor 610 (or the transistor 510) can include amorphous germanium (a-Si:H) transistor, low temperature polycrystalline germanium transistor (LTPS), indium gallium zinc oxide transistor (IGZO) or other suitable transistor, but not limited. The light-emitting element 626 may be electrically connected to the transistor 610 and the transistor 510 through the conductive elements which are disposed in the array module 500 or the light-emitting module 600.

As shown in FIG. 5, the light-emitting module 600 includes insulating layer 622 and 624. The light-emitting module 600 includes a plurality of light-emitting elements 626 and pads 628. In some embodiments, the light-emitting element 626 and the pad 628 may be surrounded by the insulating layer 622, but not limited. The insulating layers 622 may be disposed to protect the light-emitting element 626 or the pad 628 from damage or pollution (such as water or air), but not limited. The material of the insulating layer 622 (or the insulating layer 624) may include, but is not limited to, resin or another suitable material. The light-emitting element 626 and the pad 628 may be the same as or similar to the light-emitting element 320 and the pad 322 shown in FIG. 3A, respectively. In some embodiments, the order of the above layers or elements can be changed or replaced as needed. In some embodiments, the above layers can be replaced or removed as needed.

As shown in FIG. 5, the light-emitting module 600 includes a light blocking layer 630. The light blocking layer 630 may be disposed on the light-emitting element 626. The light blocking layer 630 has a plurality of openings B-O, the openings B-O may overlap with the light-emitting element 626 in Z direction. In some embodiments, the light blocking layer 630 does not overlap with the light-emitting element 626 in Z direction. The light-emitting module 600 may include a plurality of light conversion layer 632. The light conversion layer 632 may be disposed on (or cover) the light-emitting element 626. In some embodiments, the light conversion layer 632 may be adjacent to the light-emitting element 626. The material of the light conversion layer 632 may include, but is not limited to, quantum dot, fluorescent material, phosphorescent material or another conversion material. For example, the light conversion layer 632 may be an organic or an inorganic layer blended with a quantum dot. The quantum dot may include, but is not limited to, zinc, cadmium, selenium, sulfur, InP, GaSb, GaAs, CdSe, CdS, ZnS or a combination thereof, but not limited.

The light-emitting module 600 further includes a protective layer 634 and a color filter layer 636. The light-emitting element 626 may be disposed between the protective layer 634 and the substrate 602. The color filter layer 636 may be disposed between the light conversion layer 632 and the protective layer 634, but not limited. The protective layer 634 may be single layer structure, multilayer structure, composite structure, but not limited. The material of the protective layer 634 may include organic material, inorganic material, or a combination thereof. In some embodiments, the material of the protective layer 634 may be a transparent substrate. In some embodiments, the material of the protective layer 634 may include phosphosilicate glass (PSG), borophosphosilicate glass (BPSG), silicon oxide, silicon nitride, or silicon oxynitride, but not limited. In some embodiments, the color filter layer 636 may be disposed on at least one of the light conversion layer 632. In some embodiments, the color filter layer 636 may be respectively disposed on the corresponding light conversion layer 632. In some embodiments, the color filter layer 636 may overlap with at least part of the light blocking layer 630 in Z direction in order to reduce light leakage. In some embodiments (not shown), the color filter layer 636 may disposed between the light conversion layer 632 and the light-emitting element 626.

In some embodiments, the second alignment mark may be disposed in (or formed in) the second substrate. For example (FIG. 5), the second substrate 602 may be a transparent substrate or non-transparent substrate, a through hole TH may penetrate the second substrate 602, and the through hole TH may be regarded as the second alignment mark 638. In some embodiments, the through hole TH may penetrate at least part of the layers (or the elements) formed on the second substrate 602. For example (shown as FIG. 5), the through hole TH may penetrate the second substrate 602, the insulating layers 604, 606, 608, 622, 624, the light blocking layer 630 and the protective layer 634, but not limited. In some embodiments, in Z direction, a shape of the through hole TH may include rectangle, circle, triangle, polygon, arc shape, obtuse angle shape, acute angle shape, round shape or other suitable shapes, but not limited. In some embodiments, in the direction of the cross section, the through hole has an inverted trapezoid profile, rectangular profile or other shape profile, but not limited. However, the scope of the disclosure is not limiting.

As shown in FIG. 5, the second alignment mark 638 approximately overlap with (or aligned with) the first alignment mark 522 in Z direction. The second alignment mark 638 (such as through hole TH) have a bottom surface BS and top surface TS opposite to the bottom surface BS, and the bottom surface BS is near to the array module 500. In the cross section, the bottom surface BS of the second alignment mark 638 (such as through hole TH) may have a length L1, and the top surface TS of the second alignment mark 638 may have length L3. In some embodiments, the length L3 may be greater than or equal to the length L1. In some embodiments, the length L3 may be less than or equal to the length L1. In some embodiments, the length L3 also may be defined as the maximum length of the top surface TS of the second alignment mark 638 in top view, and length L1 also may be defined as the maximum length of the bottom surface BS of the second alignment mark 638 in top view.

As shown in FIG. 5, the cross section, the first alignment mark 522 has a length L2. In some embodiments, the length L1 is greater than or equal to the length L2. The length L1 is greater than the length L2 so that the CCD camera could receive both images of the first alignment mark 522 and the second alignment mark 638. In addition, there is an angle θ constituted by an extension direction of the side surface of the second alignment mark 638 (such as through hole TH) and an extension direction of the bottom surface BS of the second alignment mark 638. In some embodiments, the angle θ may be in a range from about 30° to about 110°, but not limited. In some embodiments, the angle θ is in a range from about 50° to about 90°. In some embodiments, the angle θ is in a range from about 70° to about 90°. In some embodiments, the side surface of the second alignment mark 638 (such as through hole TH) is a curved edge or an irregular edge. For example, in the Z direction, viewers can see the elements (such as first alignment mark 522 or other layers (or elements) of the array module 500) through the second alignment mark 638 (through hole TH).

As shown in FIG. 5, at least one spacer 524 may be disposed between the array module 500 and the light-emitting module 600. The spacer 524 may include resin or other suitable materials, but not limited. In some embodiments, at least one space 526 may be formed between the array module 500 and the light-emitting module 600 by the spacer 524. The space 526 may include air, transparent material or other suitable materials, but not limited.

Figure 6:
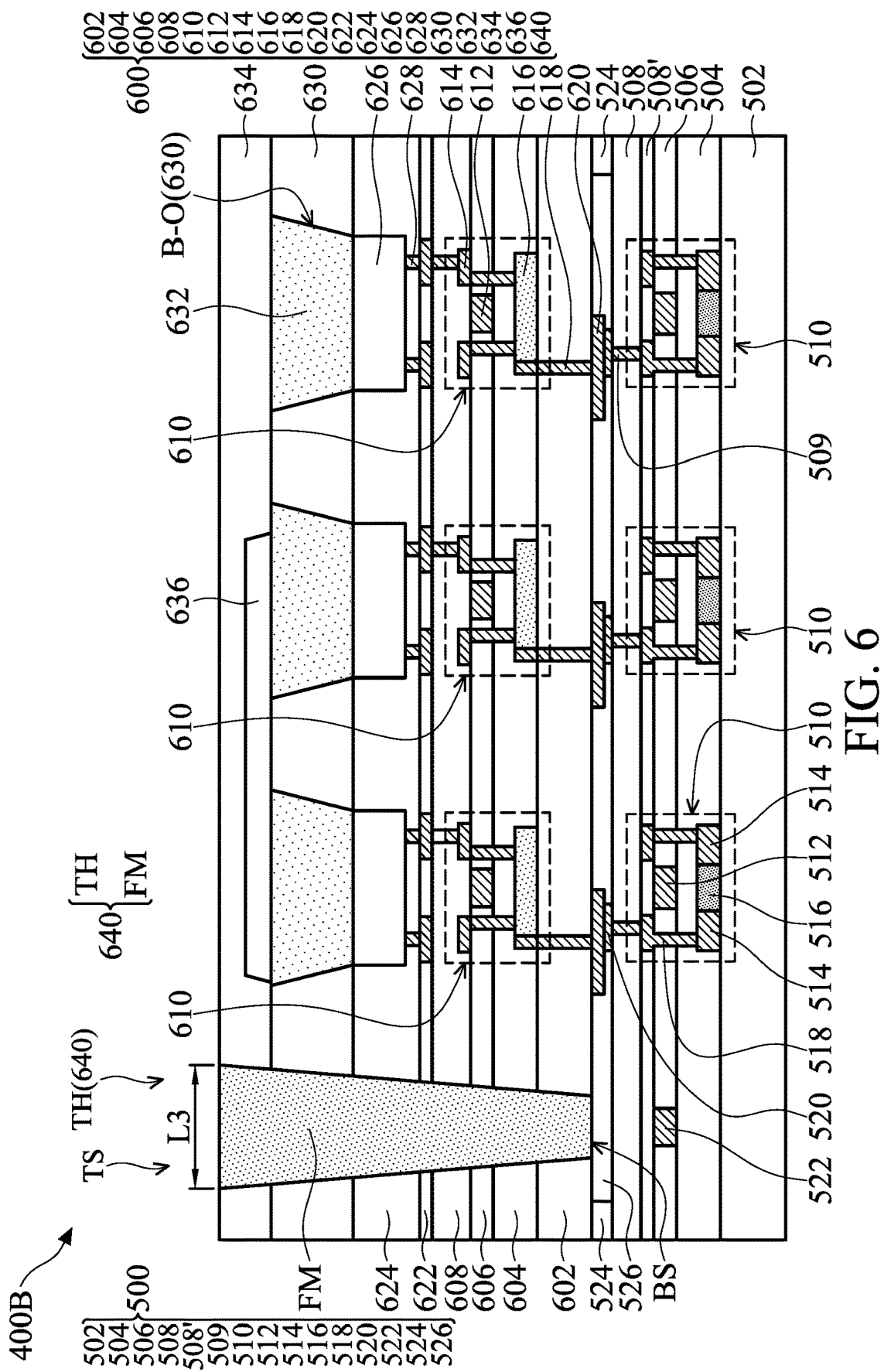

Refer to FIG. 6, which illustrates a cross-sectional view of a display device 400B in accordance with some embodiments. In some embodiments, one of the differences between the display device 400B and the display device 400A is that a second alignment mark 640 of the display device 400A may include a filling materials FM, the filling materials FM may be disposed in (or filled in) the through hole TH, and the through hole TH with the filling materials FM may be regarded as the second alignment mark 330. In some embodiments, the filling materials may include transparent material. The filling materials FM may include, but is not limited to, silicon oxide, silicon nitride, silicon oxynitride or another suitable material.

Figure 7:
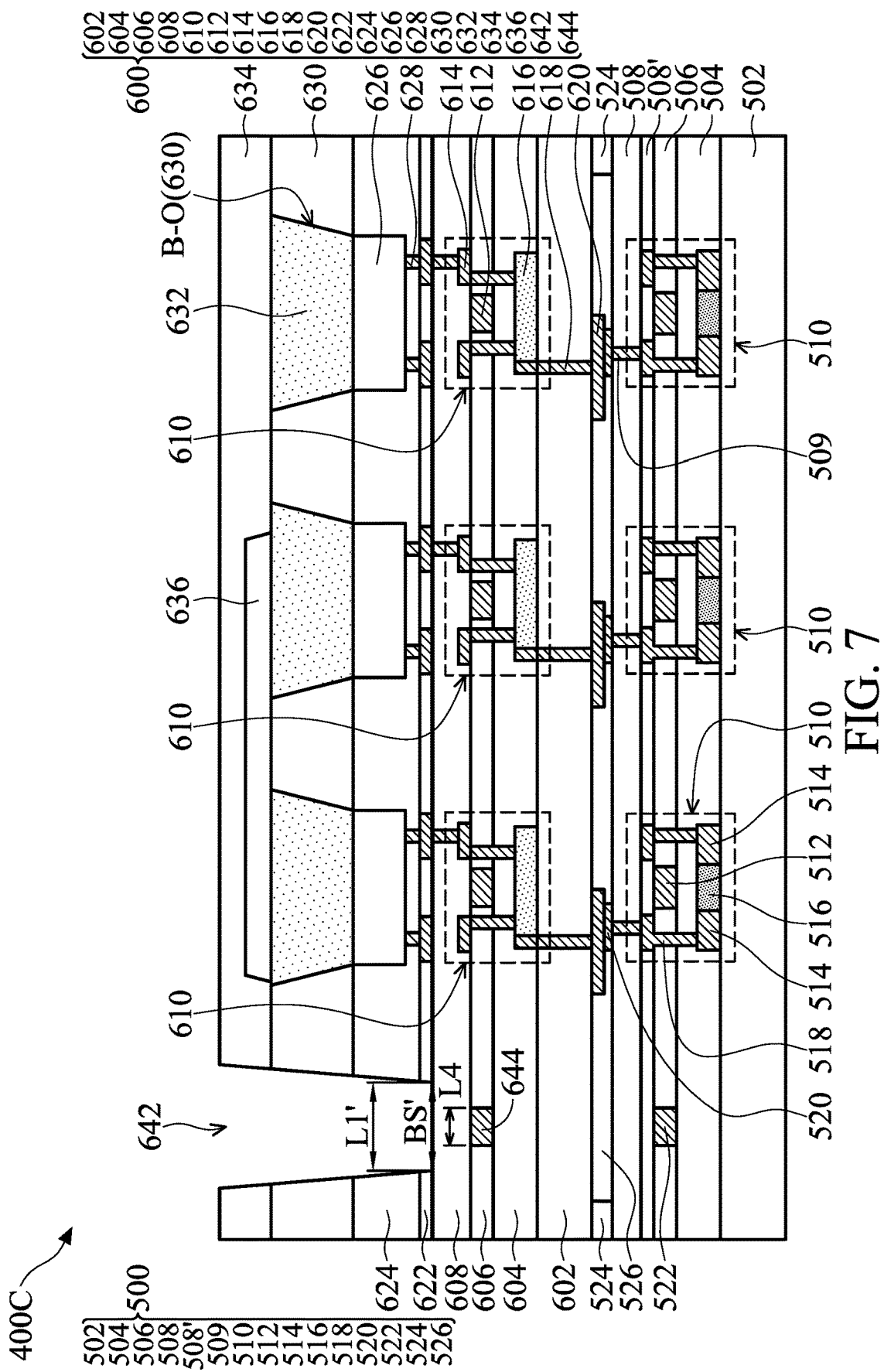

Refer to FIG. 7, which illustrates a cross-sectional view of a display device 400C in accordance with some embodiments. In some embodiments, one of the differences between the display device 400C and the display device 400A is that a notch 642 may penetrate part of layers (or elements) in the light-emitting module 600. In some embodiments (FIG. 7), the notch 642 may penetrate the insulating layers 622, 624, the light blocking layer 630 and the protective layer 634. The display device 400C may include a second alignment mark 644. The material of the second alignment mark 644 may be the same as or similar to the material of the gate electrode 612 of the transistor 610, but not limited. In some embodiments, the second alignment mark 644 and a portion of the transistor 610 (such as source/drain electrode 614) may be formed in the same process or different process. In some embodiments, the material of the second alignment mark 644 may be the same as or different from the material of a portion of the transistor 610 (such as source/drain electrode 614).

As shown in FIG. 7, the notch 642 has a bottom surface BS', and the bottom surface BS' is near to the array module 500. In the cross section, the bottom surface BS' of the notch 642 may have a length L1'. In some embodiments, the length L1' also may be defined as the maximum length of the bottom surface BS' of the notch 642 in top view. As shown in FIG. 7, the second alignment mark 644 has length L4, the length L4 may be defined as the maximum length of the second alignment mark 644 in X direction (or Y direction). In some embodiments, the length L4 is less than or equal to the length L1'. In some embodiments, at least part of the second alignment mark 644 may overlap with the first alignment mark 522 in Z direction. In some embodiments, at least part of the second alignment mark 644 may be aligned with the first alignment mark 522. In some embodiments, the shape of the notch 642 may be the same as or different from of shape of the second alignment mark 644 in Z direction.

Figure 8:
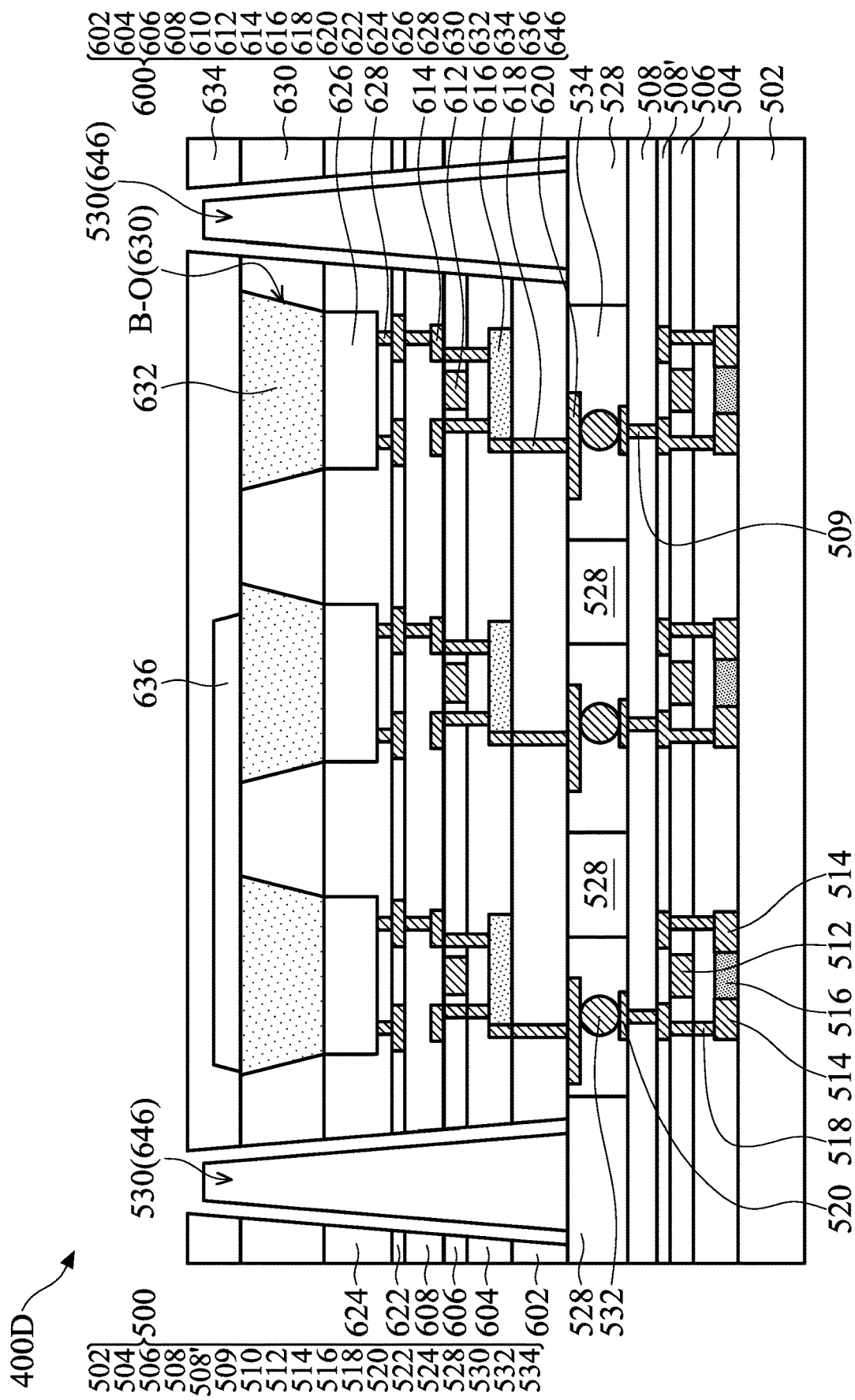

Refer to FIG. 8, which illustrates a cross-sectional view of a display device 400D in accordance with some embodiments. In some embodiments, one of the differences between the display device 400D and the display device 400A is that the array module 500 of the display device 400D may include a spacer 528 and a protruding portion 530 that is disposed on the spacer 528. The protruding portion 530 may be regarded as the first alignment mark of the array module 500. Moreover, the profile of a second alignment mark 646 of the light-emitting module 600 may be correspond to (or accordance with) the profile of the protruding portion 530. The protruding portion 530 may protrude into the second alignment mark 646 of the light-emitting module 600. In addition, the display device 400 may include a plurality of solders 532 that are electrically connected to the pads 520 and the pads 620.

As shown in FIGS. 9A-9C, a display device 700 may include two or more light-emitting modules with different arrangements. As shown in FIG. 9A, the display device 700 may include an active region 710 and a peripheral region 720 that is adjacent to (or surrounds) the active region 710. The display device 700 may include a plurality of second alignment marks 830A and 830B on the active region 710 and the peripheral region 720. As shown in FIG. 9B, a light-emitting module 800A may have a second substrate 810, light-emitting elements 820 and second alignment marks 830A. As shown in FIG. 9C, a light-emitting module 800B may have a second substrate 810, light-emitting elements 820 and second alignment marks 830B. One of the differences between the light-emitting module 800A and the light-emitting module 800B is the arrangement of the light-emitting elements 820. As shown in FIG. 9A, the display device 700 may include a plurality of second alignment marks 830A of the light-emitting module 800A and a plurality of second alignment marks 830B of the light-emitting module 800B. The arrangement of the light-emitting module 800A and the light-emitting module 800B may be adjusted according to the active region 710 and the peripheral region 720. For example, the second alignment mark 830A may be disposed on the active region 710 and the peripheral region 720. The second alignment mark 830B may be disposed on the active region 710.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A display device, comprising:
an array module having a first alignment mark, comprising:
a first substrate;
a circuit layer disposed on the first substrate; and
a plurality of pads disposed on the circuit layer; and
a light-emitting module having a second alignment mark, comprising:
a second substrate; and
a plurality of light-emitting elements disposed on the second substrate and electrically connected to the plurality of pads;
wherein the second alignment mark penetrates the second substrate and is aligned with the first alignment mark, and a mismatch between the first alignment mark and the second alignment mark is less than half of a pixel pitch of the display device.

2. The display device as claimed in claim 1, wherein the first alignment mark and the second alignment mark are in different shapes.

3. The display device as claimed in claim 1, wherein an area of the second alignment mark is greater than an area of the first alignment mark.

4. The display device as claimed in claim 1, wherein the first alignment mark is formed in the circuit layer.

5. The display device as claimed in claim 1, wherein the first alignment mark and the plurality of pads are formed in the same process.

6. The display device as claimed in claim 1, wherein the second alignment mark is formed in the second substrate.

7. The display device as claimed in claim 1, wherein the second alignment mark is not overlapped with the plurality of light-emitting elements.

8. The display device as claimed in claim 1, wherein an area of the second alignment mark is less than a pixel area of the display device.

9. The display device as claimed in claim 1, wherein the array module further comprises a third alignment mark, and the light-emitting module further comprises a fourth alignment mark,
wherein the fourth alignment mark is aligned with the third alignment mark.

10. The display device as claimed in claim 9, wherein a ratio of a first distance between the second alignment mark and the fourth alignment mark to a second distance between the first alignment mark and the third alignment mark is in a range from 0.8 to 1.2.

11. The display device as claimed in claim 1, wherein the second substrate is a growth substrate of the plurality of light-emitting elements.

* * * * *